US007751254B2

(12) United States Patent
Park et al.

(10) Patent No.: US 7,751,254 B2
(45) Date of Patent: Jul. 6, 2010

(54) METHOD OF PROGRAMMING NON-VOLATILE MEMORY DEVICE

(75) Inventors: Sang-jin Park, Pyeongtaek-si (KR); Kwang-soo Seol, Yongin-si (KR); Jung-hun Sung, Yongin-si (KR)

(73) Assignee: Samsung Electronic Co., Ltd., Gyeonggi-do (KR)

( * ) Notice: Subject to any disclaimer, the term of this patent is extended or adjusted under 35 U.S.C. 154(b) by 188 days.

(21) Appl. No.: 12/213,425

(22) Filed: Jun. 19, 2008

(65) Prior Publication Data

US 2009/0059671 A1 Mar. 5, 2009

(51) Int. Cl.
*G11C 11/34* (2006.01)

(52) U.S. Cl. ........................... 365/185.22; 365/185.19; 365/185.18

(58) Field of Classification Search ........... 365/185.22, 365/185.18, 185.19
See application file for complete search history.

(56) References Cited

U.S. PATENT DOCUMENTS 6,108,238 A * 8/2000 Nakamura et al. ..... 365/185.22
6,141,253 A * 10/2000 Lin ....................... 365/185.28
6,671,207 B1 * 12/2003 Parker ................... 365/185.22
7,002,846 B2 * 2/2006 Okimoto et al. ........ 365/185.19

* cited by examiner

*Primary Examiner*—Son Dinh
(74) *Attorney, Agent, or Firm*—Harness, Dickey & Pierce, P.L.C.

(57) ABSTRACT

A method of programming a non-volatile memory device may include performing a first programming operation including applying a program voltage to a memory cell and verifying the memory cell using a first verification voltage. A perturbation pulse may be applied to the memory cell to facilitate thermalization of charges in the memory cell if the memory cell passes the verification using the first verification voltage. The memory cell may be verified using a second verification voltage greater than the first verification voltage after the perturbation pulse is applied.

14 Claims, 14 Drawing Sheets

Vpgm
Vref'
ΔVpgm
WHEN Vref' VERIFICATION IS PASSED
Vref
Vref
PERTURBATION PULSE
PERTURBATION PULSE
FIRST PROGRAMMING OPERATION
SECOND PROGRAMMING OPERATION

METHOD OF PROGRAMMING NON-VOLATILE MEMORY DEVICE

PRIORITY STATEMENT

This application claims the benefit of priority to Korean Patent Application No. 10-2007-0087312, filed on Aug. 29, 2007, in the Korean Intellectual Property Office, the entire contents of which are incorporated herein in their entirety by reference.

BACKGROUND

1. Field

Example embodiments relate to a method of programming a non-volatile memory device, and for example, to a method of programming a non-volatile memory device which may more efficiently reduce a threshold voltage distribution in a program state.

2. Description of Related Art

Non-volatile memories are storage devices capable of maintaining stored data even if a supply of power is discontinued. Floating gate type flash memories, which are operated by storing electrical charges in a floating gate formed of polysilicon, have been commercialized as an example of larger capacity non-volatile memories. A memory cell of a flash memory is classified into a single level cell (SLC) type in which two record states of “1” and “0” are respectively recorded in a single cell, and a multi-level cell (MLC) type in which four or more record states, for example, “11”, “10”, “01”, and “00”, are respectively recorded in a single cell.

Multi-level cell technology is used in making a larger capacity NAND or NOR type flash memory. In the operation of a MLC, each of the record states may be separately recognized only if a distribution of threshold values Vth of cells corresponding to a respective record state is relatively smaller.

An incremental step pulse programming (ISPP) scheme for repeatedly applying a program voltage Vpgm while constantly increasing the program voltage Vpgm may be used to reduce a threshold voltage distribution between memory cells in a flash memory. According to the ISPP scheme, a step of applying a program voltage pulse Vpgm while increasing the amount of an input program voltage pulse by ΔVpgm and checking a threshold voltage of a memory cell by applying a verifying voltage pulse is repeated so that the threshold voltage of the memory cell reaches a desired, or alternatively, a predetermined value. Because a plurality of memory cells forming a flash memory have an initial threshold voltage distribution, the ISPP scheme is introduced to allow all memory cells to reach a desired, or alternatively, a predetermined threshold voltage by considering the threshold voltage distribution for each memory cell.

However, as a size of a cell decreases in a flash memory using a floating gate, coupling between cells, in particular, coupling between the floating gates, increases such that controlling the distribution of the threshold voltage is more difficult. Recently, to reduce the coupling between cells, a charge trap flash (CTF) memory using, instead of the floating gate, an insulating layer including a charge trap site, e.g., silicon nitride $Si_3N_4$, as a charge trap layer, which may trap electrical charges, has been developed.

During programming of the CTF memory, implanted electrons are trapped in the charge trap layer and localized therein. The injected electrons are thermalized in a deep trap and spatially spread in a nitride film. Accordingly, because the threshold voltage of the CTF memory changes as the electrons are thermalized and spread in the nitride film, e.g., during the thermalization of the localized electrons, time is needed until the threshold voltage Vth is fixed.

Therefore, in the CTF memory, the threshold voltage Vth characteristically changes according to time due to the movement of the charges trapped in the charge trap layer after programming. The time-dependent threshold voltage change makes controlling the distribution of a threshold voltage during programming in the ISPP scheme more difficult.

If the threshold voltage Vth changes according to the time, an error may occur in the verification of a program state after a desired, or alternatively, a predetermined time has passed after the programming. Due to such a verification error, the distribution of a threshold voltage of a program state obtained by the ISPP type program may increase.

For example, if the threshold voltage changes according to time, even if the threshold voltage may reach a target value as time passes, a verification error may occur as a result of verification because a memory cell fails to reach the threshold voltage before the verification. If the target threshold voltage is verified to have not been reached, a program voltage that is increased by ΔVpgm is applied for programming so that an over-program occurs in which the threshold voltage excessively increases. Accordingly, the distribution of the threshold voltage of the program state increases.

SUMMARY

Example embodiments provide a method of programming a non-volatile memory device which may reduce a distribution of a threshold voltage of a program state by reducing an occurrence of over-programming.

According to an example embodiment, a method of programming a non-volatile memory device may include performing a first programming operation including applying a program voltage to a memory cell and verifying the memory cell using a first verification voltage. A perturbation pulse may be applied to the memory cell to facilitate thermalization of charges in the memory cell if the memory cell passes the verification using the first verification voltage. The memory cell may be verified using a second verification voltage greater than the first verification voltage after the perturbation pulse is applied.

According to an example embodiment, the method may include performing a second programming operation including applying the program voltage to the memory cell, applying the perturbation pulse to facilitate the thermalization of charges in the memory cell, and verifying the memory cell using the second verification voltage if the memory cell does not pass the verification using the second verification voltage.

According to an example embodiment, in the second programming operation, the applying the program voltage, the application of the perturbation pulse, and/or the verification using the second verification voltage may be repeated by increasing an amount of the program voltage step by step each repetition until the memory cell passes the verification using the second verification voltage in the second programming operation.

According to an example embodiment, in the first programming operation, the applying the program voltage and/or the verifying the memory cell using the first verification voltage may be repeated by increasing the amount of the program voltage step by step each repetition until the verification using the first verification voltage is passed in the first programming operation.

According to an example embodiment, in the first programming operation, the applying the program voltage and/or the verifying the memory cell using the first verification voltage may be repeated by increasing an amount of the program voltage step by step each repetition until the verification using the first verification voltage is passed in the first programming operation.

According to an example embodiment, if the first verification voltage is Vref' and the second verification voltage is Vref, Vref'=Vref−xV, where 0<x<1 and V is a voltage.

According to an example embodiment, a difference between the first and second verification voltages may be based on a difference between a threshold voltage value of the memory cell during a verification of the memory cell and a threshold value of the memory cell after thermalization of the memory cell.

According to an example embodiment, the memory cell may include a control gate and/or a charge storage layer. The program voltage may be applied to the control gate of the memory cell. The perturbation pulse may be applied to one of the control gate of the memory cell, a substrate on which the memory cell is formed, and a channel of the memory cell.

According to an example embodiment, the perturbation pulse may apply an electric field opposite to an electric field of the program voltage.

According to an example embodiment, the memory cell may be one of a floating gate type flash memory cell and a charge trap type flash memory cell.

According to an example embodiment, the memory cell may be a memory cell selected from a plurality of memory cells arranged in a NAND structure between a common source line and a plurality of bit lines on the substrate.

According to an example embodiment, the verification of the memory cell using the first verification voltage may verify a threshold voltage of the memory cell, and the verification of the memory cell using the second verification voltage may verify the threshold voltage of the memory cell.

BRIEF DESCRIPTION OF THE DRAWINGS

The above and/or other aspects and advantages will become more apparent and more readily appreciated from the following detailed description of example embodiments taken in conjunction with the accompanying drawings of which.

DETAILED DESCRIPTION OF EXAMPLE EMBODIMENTS

Figure 1:
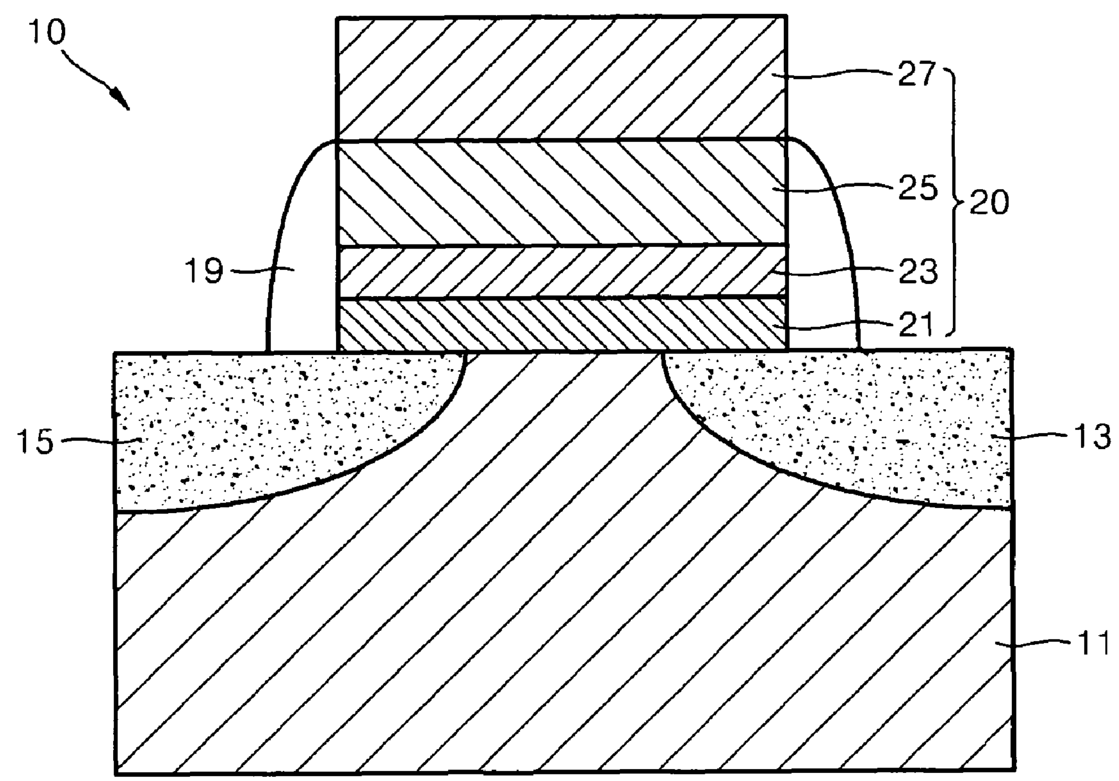
FIG. 1 illustrates an example of a flash memory cell adopting a programming method according to example embodiments in order to perform a programming operation.

Example embodiments will now be described more fully hereinafter with reference to the accompanying drawings. Embodiments may, however, be in many different forms and should not be construed as being limited to the example embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when a component is referred to as being "on," "connected to" or "coupled to" another component, it can be directly on, connected to or coupled to the other component or intervening components may be present. In contrast, when a component is referred to as being "directly on," "directly connected to" or "directly coupled to" another component, there are no intervening components present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one component or feature's relationship to another component(s) or feature(s) as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Reference will now be made to example embodiments, which are illustrated in the accompanying drawings, wherein like reference numerals refer to the like components throughout.

A programming method according to example embodiments may be applied to a non-volatile memory device capable of recording data using charge storage, for example, a flash memory device. The flash memory device may include a plurality of memory cells, each of the memory cells having a charge storage layer and a control gate. The charge storage layer may be a floating gate or a charge trap layer. For example, the memory cell may be one of a floating gate type flash memory cell and a charge trap type flash memory cell.

FIG. 1 illustrates an example of a flash memory cell 10 adopting a programming method according to example embodiments to perform a programming operation. The flash memory cell 10 may be a memory cell of a NAND type flash memory device as will be described later with reference to FIG. 2.

Referring to FIG. 1, the flash memory cell 10 may include a substrate 11 and/or a gate structure 20 formed on the substrate 11. First and second doped regions 13 and 15, which may be doped with a desired, or alternatively, a predetermined conductive impurity, may be formed in the substrate 11. One of the first and second doped regions 13 and 15 may be used as a drain D and the other one may be used as a source S.

The gate structure 20 may include a tunneling insulating film 21 formed on the substrate 11, a charge storage layer 23 formed on the tunneling insulating film 21, and/or a blocking insulating film 25 formed on the charge storage layer 23. A control gate 27 may be formed on the blocking insulating film 25. In FIG. 1, the gate structure 20 may further include a spacer 19 formed on sidewalls of the tunneling insulating film 21, the charge storage layer 23, and/or the blocking insulating film 25.

The tunneling insulating film 21 may be a film for tunneling charges. The first and second doped regions 13 and 15 may be formed in the substrate 11 such that the first and second doped regions 13 and 15 to be electrically connected to the tunneling insulating film 21. The tunneling insulating film 21 may be a tunneling oxide film formed of, for example, $SiO_2$, various high-k oxides, or a combination thereof.

Alternatively, the tunneling insulating film 21 may be formed of a silicon nitride film, for example, $Si_3N_4$. For a silicon nitride film, an impurity concentration may not be relatively high, e.g., the impurity concentration of the silicon nitride film may be similar to that of a silicon oxide film, and/or an interface characteristic with silicon may be superior. As another alternative, the tunneling insulating film 21 may have a dual layer structure of a silicon nitride film and an oxide film. As described above, the tunneling insulating film 21 may be a single layer structure of an oxide or nitride or a multilayer structure of materials having different energy band gaps.

The charge storage layer 23 may be an area where information is stored by charge storage, and/or the charge storage layer 23 may be formed of a charge trap layer or a floating gate. For example, in order to function as a charge trap layer, the charge storage layer 23 may include any one of a nitride, a high-k dielectric having a higher permittivity, and/or nanodots. For example, the charge storage layer 23 may be formed of a nitride, e.g., $Si_3N_4$, or a high-k oxide, e.g., $HfO_2$, $ZrO_2$, $Al_2O_3$, HfSiON, HfON, or HfAlO. The charge storage layer 23 may include a plurality of nanodots discontinuously arranged as a charge trap site, and/or the nanodots may be formed in a nanocrystal form. If the charge storage layer 23 is formed to function as the charge trap layer, the flash memory cell 10 may become a charge trap flash (CTF) memory cell.

The charge storage layer 23 may include polysilicon. If the charge storage layer 23 includes polysilicon, the charge storage layer 23 may function as a floating gate and the flash memory cell 10 may become a floating gate type flash memory cell.

The blocking insulating film 25 may reduce an occurrence of charges moving upward after passing an area where the charge storage layer 23 is formed. The blocking insulating film 25 may be formed of an oxide layer. The blocking insulating film 25 may be formed of $SiO_2$ or a high-k material having a permittivity higher than that of the tunneling insulating film 21, for example, $Si_3N_4$, $Al_2O_3$, $HfO_2$, $Ta_2O_5$, or $ZrO_2$. The blocking insulating film 25 may be formed as a multilayer structure. For example, the blocking insulating film 25 may have a structure of two layers or more including an insulating layer formed of a typical insulating material, e.g., $SiO_2$, and a higher dielectric layer formed of a material having a permittivity higher than that of the tunneling insulating film 21.

The control gate 27 may be formed of a metal layer, for example, TaN, Al, Ru, or a silicide material, e.g., NiSi. If electrons are implanted in the flash memory cell 10, the implanted electrons may be stored in the charge storage layer 23 and have a threshold voltage in a program state.

The memory cell of a flash memory device may have two states, e.g., a program state and an erasure state. According to an example embodiment, the erasure state may be an ON state in which current flows to a drain connected to a bit line (not shown) due to a voltage supplied to the control gate 27 during reading by decreasing a threshold voltage of the flash memory cell 10. The program state may be an OFF state in which current does not flow to the drain D connected to the bit line due to the voltage supplied to the control gate 27 during reading by increasing the threshold voltage of the flash memory cell 10.

A programming method according to example embodiments may be applied to programming of a flash memory device including the above-described floating gate type or a charge trap type flash memory cell.

Figure 2:
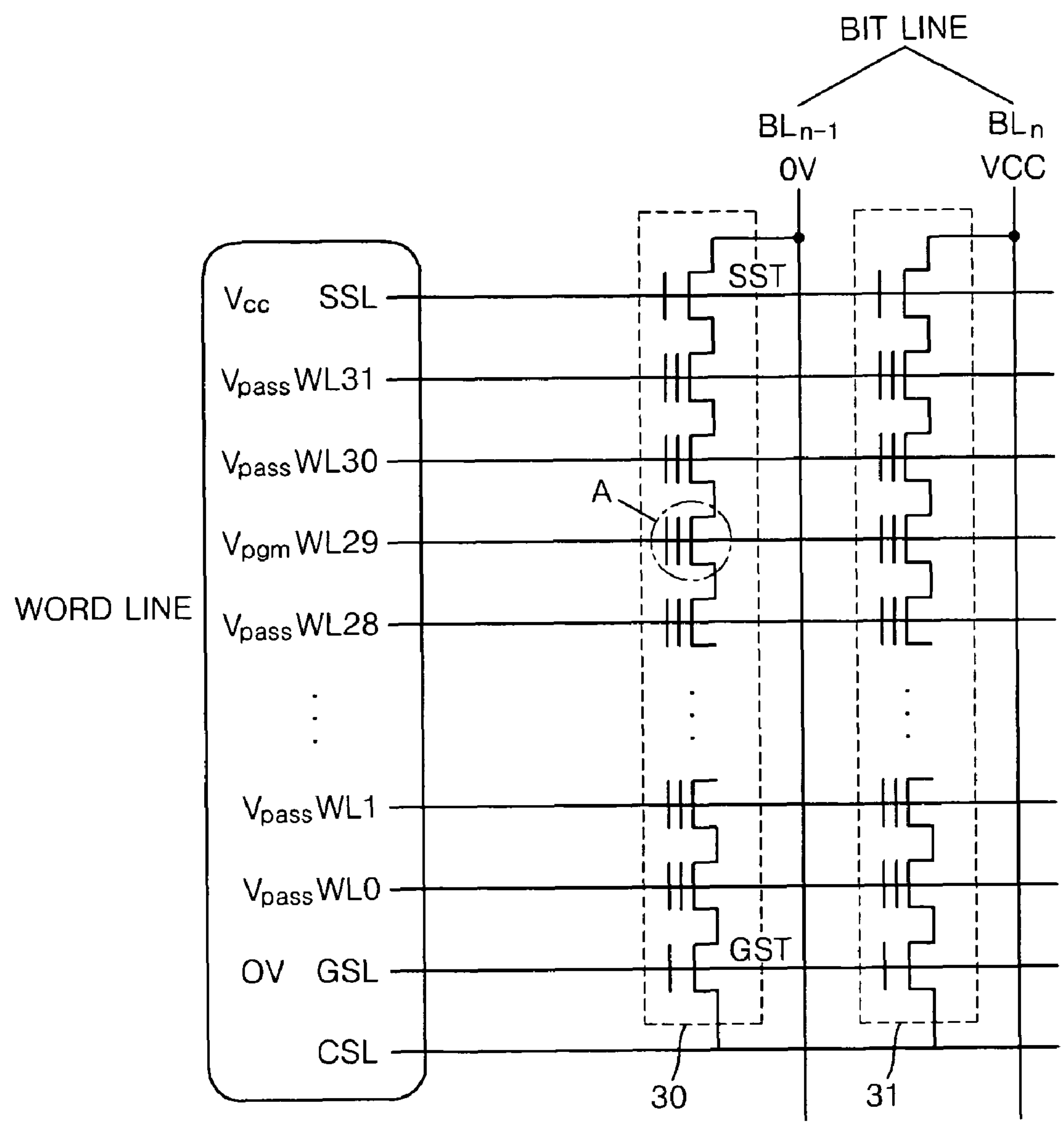
FIG. 2 is a circuit diagram of a NAND type flash memory device as an example of a non-volatile memory device adopting a programming method according to example embodiments.

FIG. 2 is a circuit diagram of a NAND type flash memory device as an example of a non-volatile memory device adopting a programming method according to example embodiment. Referring to FIG. 2, the NAND type flash memory device may be formed of a plurality of cell strings. In FIG. 2, two cell strings 30 and 31 are shown as an example. However, the NAND type flash memory device may have more or less than two cell strings.

Each of the cell strings 30 and 31 may include a plurality of memory cells each sharing a source and a drain with a neighboring memory cell. Each memory cell of the cell strings 30 and 31 may be formed of either a charge trap type flash memory cell or a floating gate type flash memory cell.

A Ground Selection Transistor (GST), a plurality of memory cells, and/or a String Selection Transistor (SST) are connected in series in each cell string. One end of each cell string may be connected to a bit line and the other end may be connected to a Common Source Line (CSL). The GST may be connected to the CSL and the SST may be connected to the bit line.

In a direction crossing an extension direction of the cell strings 30 and 31, Word Lines (WL) may connected to control gates 27 of the memory cells. The String Selection Line (SSL) may be connected to a gate of the SST, and the Ground Selection Line (GSL) may be connected to a gate of the GST.

Data programmed in the memory cell may vary according to a voltage of the bit line. If a voltage of the bit line is a power voltage Vcc, programming may be prohibited. If the voltage of the bit line is a ground voltage 0V, programming may be permitted. In FIG. 2, the ground voltage 0V may be supplied to a bit line BLn-1 and the power voltage Vcc may be supplied to a bit line BLn.

During programming, a program voltage Vpgm may be supplied to a selected word line, for example, a word line WL29. A pass voltage Vpass may be supplied to the unselected word lines, for example, word lines WL31, WL30, and WL28-WL0. For example, a voltage that increases by 0.5 V step by step with a basic voltage of 16 V may be provided as the program voltage Vpgm and a voltage of 9 V may be provided as the pass voltage Vpass. The power voltage Vcc may be supplied to the SSL and the ground voltage 0V may be supplied to the GSL.

In the selected word line WL 29, a memory cell corresponding to a bit line BLn-1 to which the ground voltage is supplied may be programmed. In FIG. 2, a memory cell A is programmed.

Figure 3:
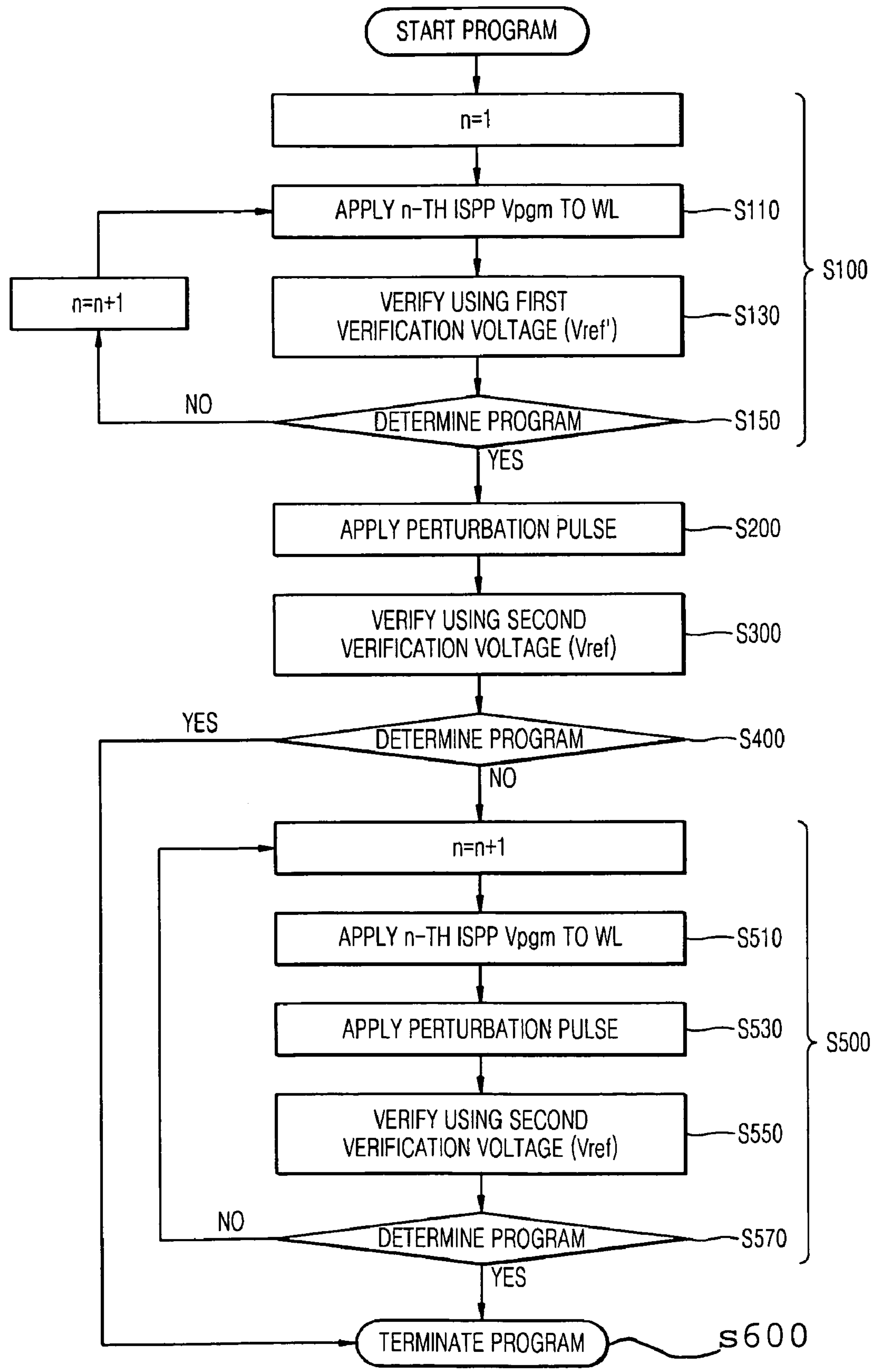
FIG. 3 is a flowchart showing a method of programming a non-volatile memory device according to an example embodiment.

A method of programming a non-volatile memory device according to an example embodiment is shown in FIG. 3. In a programming method according example embodiments, to reduce a distribution of a threshold voltage of a program state by reducing the occurrence of over-programming, a verification voltage may be applied in two steps of a relatively lower verification voltage and a relatively higher verification voltage during the programming in an incremental step pulse programming (ISPP) scheme. After the verification using the relatively lower verification voltage is passed, a perturbation pulse may be applied to facilitate the thermalization of charges. Accordingly, because the threshold voltage is more quickly thermalized as the charges are thermalized within a shorter time, over-programming in which a program voltage is applied again because of a determination error representing that the threshold voltage is lower than a reference value may be reduced. Therefore, the threshold voltage distribution of the program state may be greatly reduced compared to a case where programming using a general ISPP scheme is used. By applying the verification voltage in two steps, because the perturbation pulse is applied only if the memory cell reaches a desired, or alternatively, a predetermined threshold voltage or more, an increase in a programming time due to the addition of the perturbation pulse may be reduced.

Figure 4:
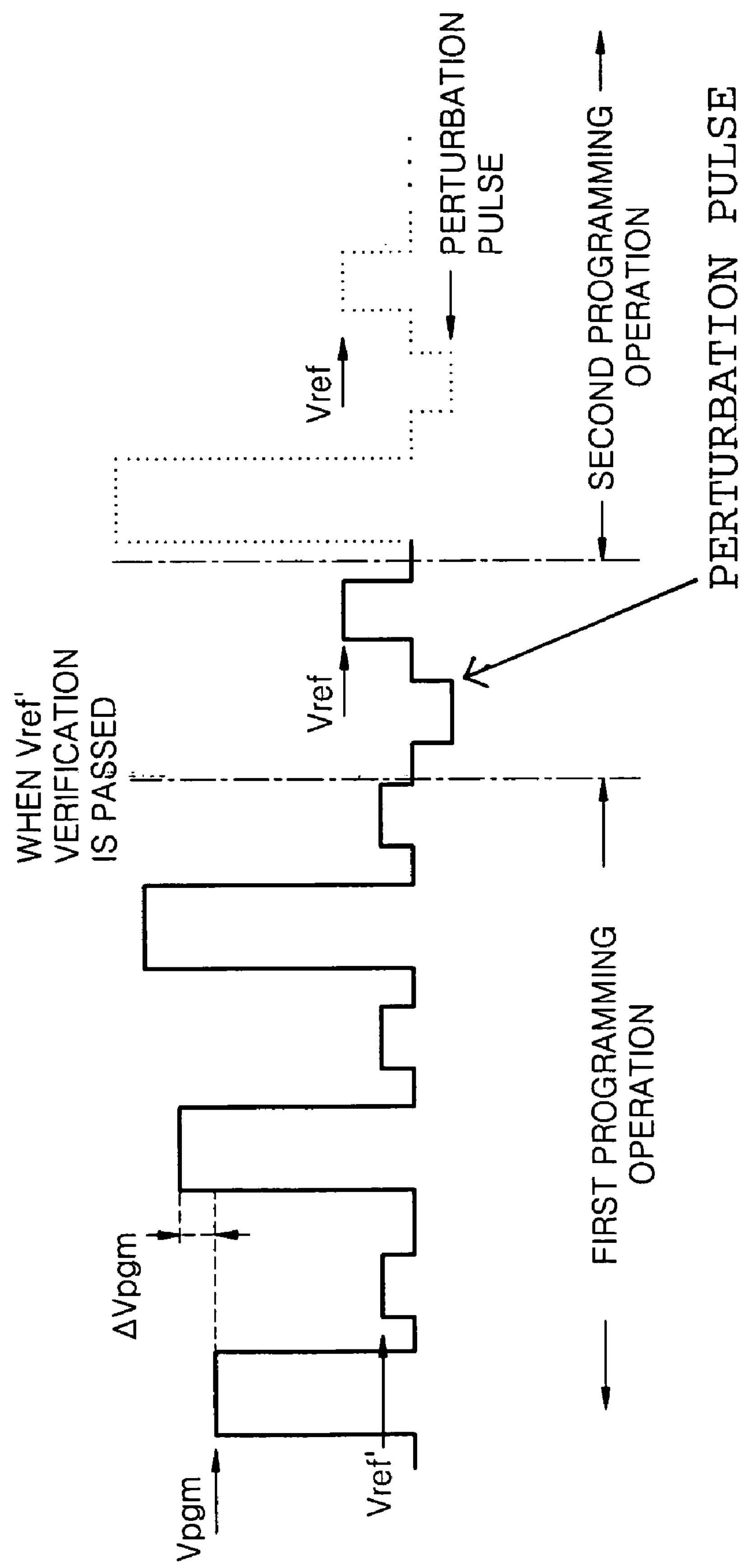
FIG. 4 illustrates an improved incremental step pulse programming (ISPP) scheme according to the programming method of FIG. 3.

FIG. 3 is a flowchart showing a method of programming a non-volatile memory device according to an example embodiment. FIG. 4 illustrates an improved ISPP scheme according to the programming method of FIG. 3.

Referring to FIGS. 3 and 4, a programming method according to an example embodiment may include applying a program voltage Vpgm to a memory cell and verifying with a first verification voltage Vref' (a first programming operation; S100), applying a perturbation pulse to facilitate thermalization of charges to the memory cell passing the verification using the first verification voltage Vref' (S200), and performing verification using a second verification voltage Vref that is greater than the first verification voltage Vref' after the perturbation pulse is applied (S300).

A programming method according to an example embodiment may include a second programming operation (S500) that is performed if an operation determining whether the verification using the second verification voltage Vref is passed (S400) determines the verification using the second voltage is not passed. In the second programming operation (S500), the program voltage Vpgm may be applied to the memory cell, the perturbation pulse may be applied to facilitate the thermalization of charges, and/or the verification may be performed using the second verification voltage Vref.

If the ISPP scheme is employed, in the first programming operation (S100), the application of the program voltage Vpgm by increasing the amount of the program voltage Vpgm step by step and/or the verification operation using the first verification voltage Vref' may be repeated until the verification using the first verification voltage Vref' is passed. Similarly, in the second programming operation (S500), the application of the program voltage Vpgm by increasing the amount of the program voltage Vpgm step by step, the application of the perturbation pulse, and/or the verification operation using the second verification voltage Vref' may be repeated until the verification using the second verification voltage Vref is passed.

Referring to FIGS. 2-4, a programming method according to an example embodiment if the ISPP scheme is applied is described in detail. If a program mode begins, a desired, or alternatively, a predetermined word line WL, for example, the word line WL29, may be selected by data input. A memory cell connected to the selected word line WL29 and a bit line BLn-1, which is set to the ground voltage 0 V, may be selected. Accordingly, programming according to an example embodiment may be performed on the selected memory cell. As described above, FIG. 2 shows an example in which the memory cell A located on the word line WL29 is selected.

The programming according to the first programming operation (S100) may be performed on the selected memory cell. In the first programming operation (S100), operations of applying the program voltage Vpgm (S110), performing the verification using the first verification voltage Vref' (S130), and/or determining whether the verification using the first verification voltage Vref' is passed (S150) may be repeated by increasing the program voltage Vpgm step by step by ΔVpgm until the verification using the first verification voltage Vref' is passed.

For example, the n-th ISPP Vpgm may be applied to the word line WL. The ISPP Vpgm if n=1 may be an initial program voltage applied during the ISPP scheme. If the program voltage Vpgm increases step by step, for example, by 0.5 V from 16 V, the ISPP Vpgm if n=1 is 16 V. Because the ISPP Vpgm and the first verification Vref' are applied to the word line WL, the program voltage Vpgm may be substantially applied to the selected memory cell via the control gate 27.

If, in the first programming operation (S100), the verification using the first verification voltage Vref' is determined as a fail (S150), the program voltage Vpgm may be incremented by a step and processing may return to step (S110). If, in the first programming operation (S100), the verification using the first verification voltage Vref' is determined as a pass (S150), the perturbation pulse to facilitate the thermalization of charges to the selected memory cell is applied (S200). The selected memory cell may be verified by using the second verification voltage Vref that is greater than the first verification voltage Vref' (S300). A determination may be made as to whether the selected memory cell is programmed to have a threshold voltage corresponding to a desired, or alternatively, a predetermined threshold voltage, e.g., a threshold voltage corresponding to the second verification voltage Vref (S400).

If the selected memory cell passes the determination using the second verification voltage Vref in the program determination operation (S400), the program may be terminated (S600). If the selected memory cell does not pass the determination using the second verification voltage Vref in the program determination operation (S400), the second programming operation (S500) may be performed.

The second programming operation (S500) may include applying the n-th ISPP Vpgm to the word line WL (S510), applying the perturbation pulse (S530), performing verification using the second verification voltage Vref (S550), and/or determining whether the verification using the second verification voltage Vref is passed (S570). The second programming operation (S500) may be repeated by increasing the program voltage Vpgm step by step by ΔVpgm until the verification using the second verification voltage Vref is passed. If the second programming operation (S500) determines that the selected memory cell passes the verification using the second verification voltage Vref, the program may be terminated (S600).

The ISPP Vpgm applied first to the word line WL in the second programming operation (S500) may be a voltage obtained by increasing the ISPP Vpgm that is applied last in the first programming operation (S100) step by step by ΔVpgm. For example the ISPP Vpgm applied to the word line WL in the second programming operation (S500) may be increased by one step of ΔVpgm before being applied in the second programming operation (S500) for a first time and for each time thereafter. In the second programming operation (S500), because the ISPP Vpgm and the second verification voltage Vref may be applied to the word line WL, the program voltage Vpgm may be substantially applied to the selected memory cell via the control gate 27.

In the perturbation pulse application operations (S200 and S530), the perturbation pulse may apply an electric field opposite to the electric field of the program voltage Vpgm. For example, as shown in FIG. 4, the perturbation pulse may be a DC voltage having a polarity opposite to that of the program voltage Vpgm. For example, the perturbation pulse may be a DC perturbation voltage having a polarity opposite to that of the program voltage Vpgm. An amplitude of the perturbation pulse may be less than that of the program voltage Vpgm.

Figure 5A:
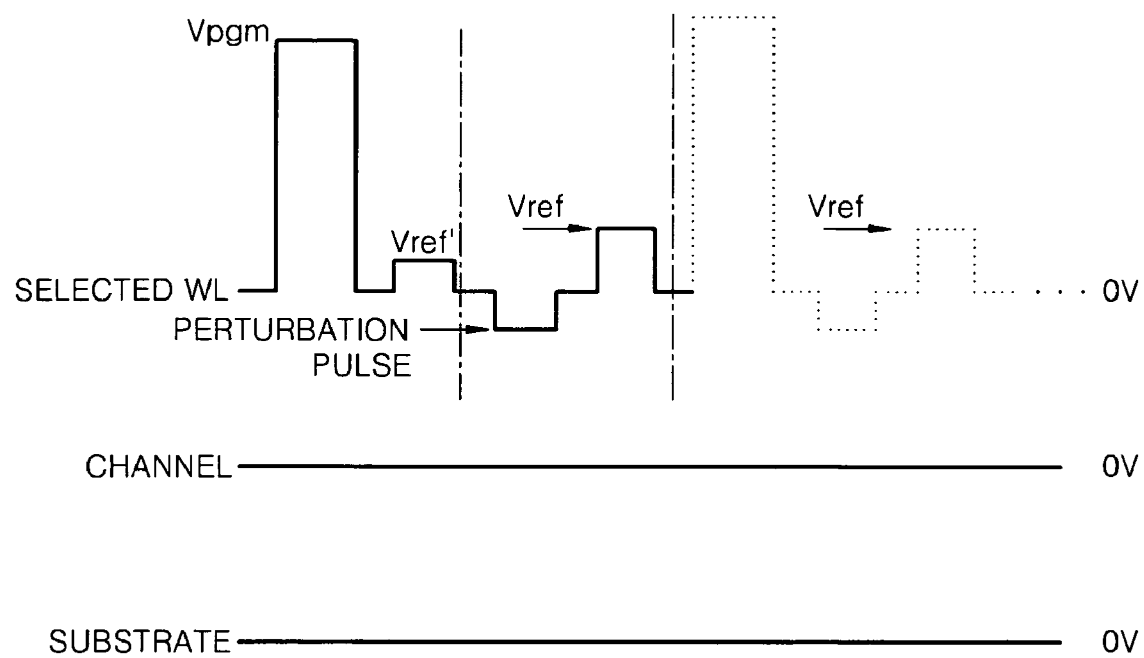
FIGS. 5A-5C respectively illustrate example embodiments in which a perturbation pulse is applied via a control gate, a channel, and a substrate of a selected memory cell if a program voltage and a verification voltage are applied through a selected word line WL, e.g., a control gate of a selected memory cell.
Figure 5B:
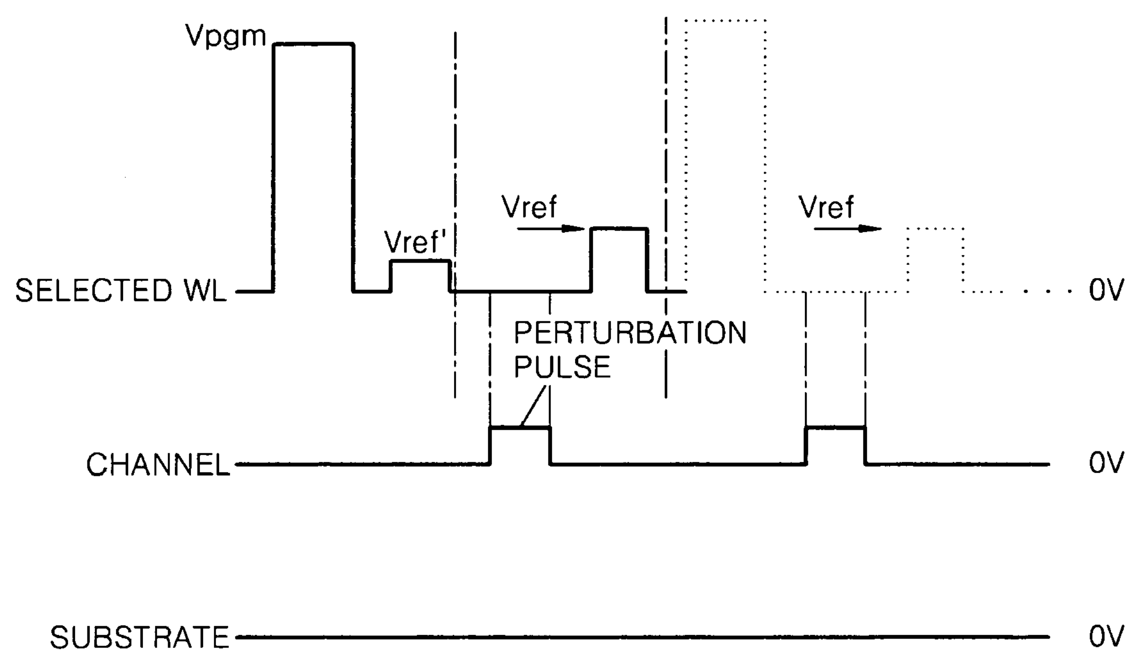
Figure 5C:
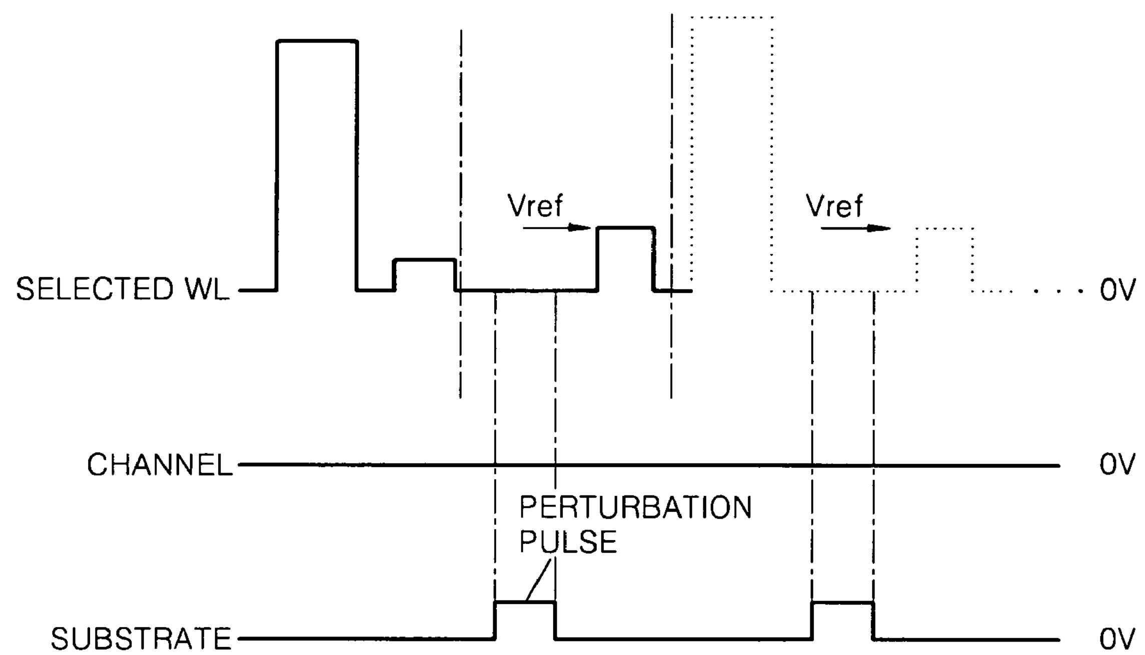

FIGS. 5A-5C respectively illustrate example embodiments in which a perturbation pulse is applied via a control gate, a channel, and a substrate of a selected memory cell if a program voltage and a verification voltage are applied through the word line WL, e.g., the control gate of the selected memory cell. The perturbation pulse may be applied via the selected word line WL, e.g., the control gate of the selected memory cell, as shown in FIG. 5A. The perturbation pulse may be applied via a channel of the selected memory cell, as shown in FIG. 5B. The perturbation pulse may be applied via a semiconductor substrate (e.g., a bulk) of a non-volatile memory device where a plurality of memory cells is formed, as shown in FIG. 5C.

If the perturbation pulse is applied as a negative pulse with the program voltage Vpgm or the first verification voltage Vref' via the selected word line (e.g., the control gate), as shown in FIG. 5A, the non-volatile memory device adopting a programming method according to an example embodiment may include a voltage generator configured to generate a negative voltage.

As shown in FIG. 5B, if the perturbation pulse is applied to the channel of the selected memory cell, the perturbation pulse may be substantially applied via a bit line to which an end of the cell string including the selected memory cell is connected, for example, $BL_{n-1}$ in FIG. 2. As described above, the cell string may include an array of a plurality of memory cells, each sharing a source/drain with a neighboring memory cell. An end of the cell string may be connected to the bit line and the other end thereof may be connected to the CSL.

FIGS. 4-5C show an example in which the perturbation pulse is a DC pulse having a polarity opposite to that of the program voltage Vpgm. However, the type of the perturbation pulse is not limited thereto. For example, the perturbation pulse may be an AC pulse.

If the perturbation pulse is applied as described above, charges injected in the charge storage layer of the selected memory cell may be more uniformly distributed at a faster speed in the charge storage layer. Accordingly, compared to a case where the perturbation pulse is not applied, a time from the injection of the charges in the charge storage layer to the fixation of the threshold voltage of the memory cell may be greatly shortened.

An effect of improving the threshold voltage distribution according to the application of a perturbation pulse in a programming method of example embodiments is described below through a comparison with a conventional programming method adopting the general ISPP scheme.

Figure 6:
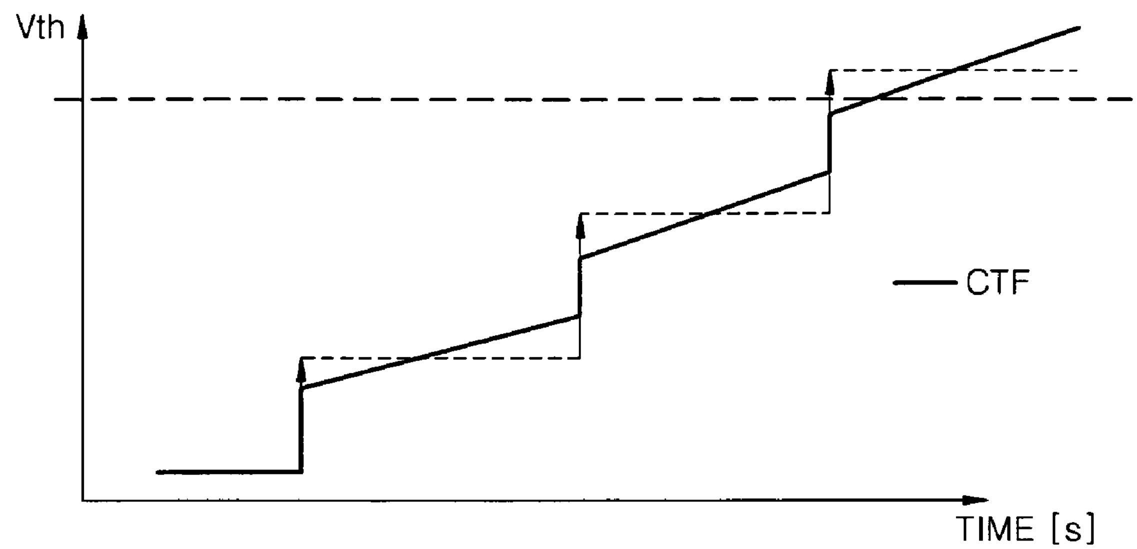
FIG. 6 is an example waveform diagram of a voltage pulse applied to a selected word line during programming in a general ISPP scheme and shows a change in the threshold voltage during programming of a charge trap flash (CTF) memory cell using an ISPP voltage pulse.
Figure 6:
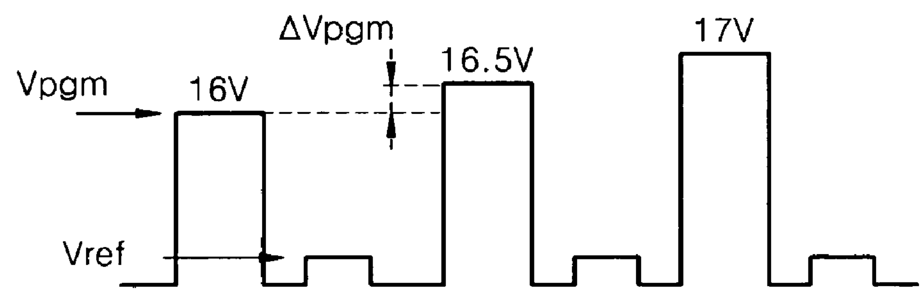
Figure 7A:
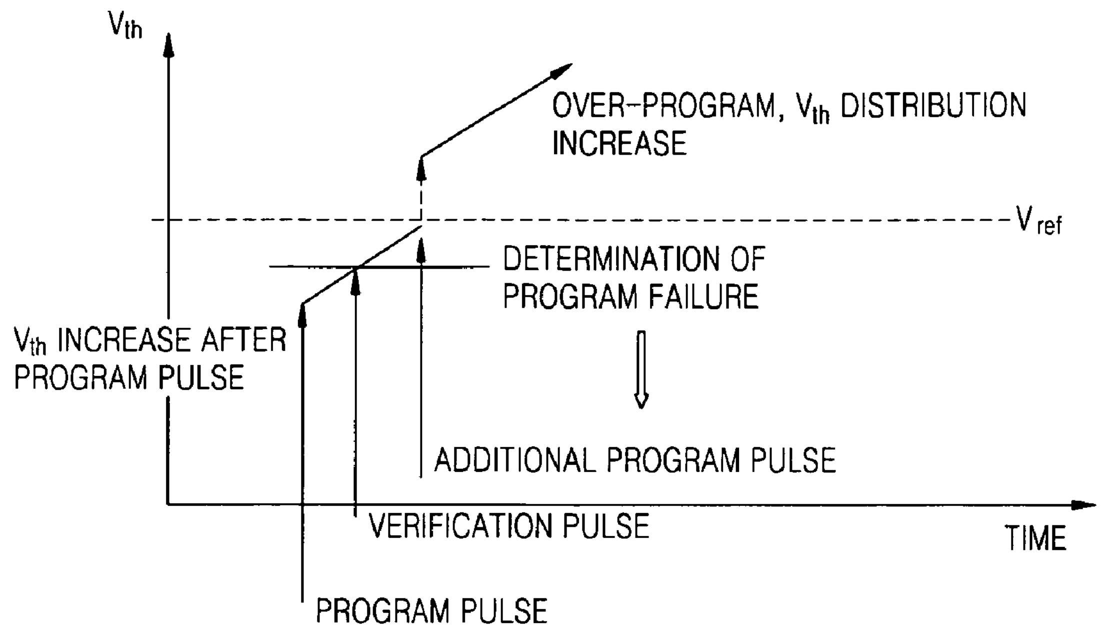
FIGS. 7A and 7B are example graphs showing a program scheme and the distribution of a threshold voltage of memory cells if a conventional programming method is applied.
Figure 7B:
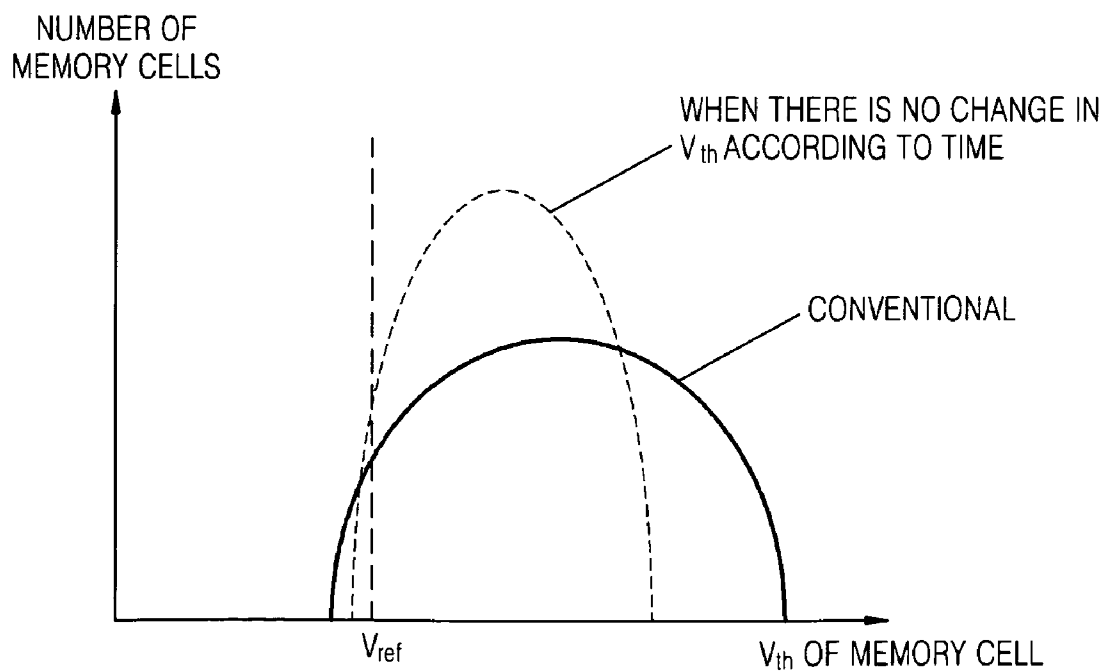

FIG. 6 is an example waveform diagram of a voltage pulse applied to a selected word line during programming in the general ISPP scheme and shows a change in a threshold voltage during the programming of a CTF memory cell using the ISPP voltage pulse. FIGS. 7A and 7B are example graphs showing a program scheme and a distribution of a threshold voltage of a memory cell if a conventional programming method is applied.

Referring to FIG. 6, according to the general ISPP scheme, the memory cell selected by applying the program voltage Vpgm to the word line is programmed and a verification voltage Vvef is applied for the verification of the selected memory cell. If the selected memory cell is determined to have failed to reach a desired, or alternatively, a predetermined threshold voltage, a program voltage Vpgm, which is increased by a desired, or alternatively, a predetermined amount, is applied to perform programming again, and the verification is performed again. In the general ISPP scheme, the program voltage Vpgm is increased step by step until the memory cell is programmed to reach a set threshold voltage, and the verification operation is performed for every programming operation.

In the programming using the general ISPP scheme, a program voltage application operation and a verification operation are repeated by increasing the program voltage Vpgm step by step, for example, from 16 V by 0.5 V.

During the above programming, the charge trap type flash memory cell may have a transient threshold voltage (Vth) characteristic in that the threshold voltage (Vth) increases according to time after a program pulse is applied. Therefore, for example, if programming is performed using a program pulse of 17 V and the threshold voltage is determined to be lower than the verification voltage Vref, the threshold voltage may gradually increase with to time so that the threshold voltage eventually may exceed the verification voltage Vref.

Accordingly, as shown in FIG. 7A, the programming may be determined as failed in the verification operation and a program pulse may be added again such that the memory cell is eventually over-programmed. Therefore, as shown in FIG. 7B, a distribution of a threshold voltage of the memory cell is greater as compared to a case in which no change exists in the threshold voltage according to time.

If the programming is performed using the general ISPP scheme, even a sufficiently programmed memory cell may be determined as program failure due to the transient threshold voltage characteristic, and therefore, be additionally programmed so that the wider distribution of the threshold voltage is more highly likely to be generated.

Figure 8:
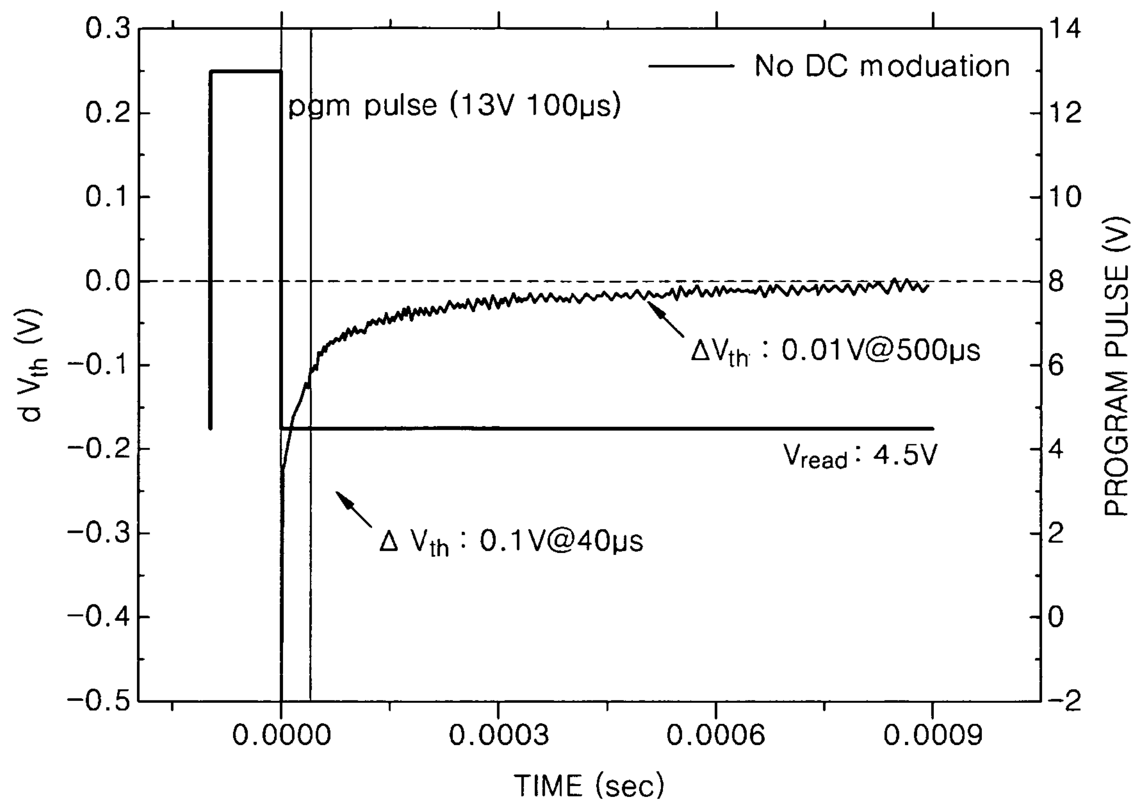
FIG. 8 is an example graph showing a change of a threshold voltage of a memory cell after a program voltage is applied.

FIG. 8 is an example graph showing a change in a threshold voltage of a memory cell after a program voltage Vpgm is applied. In FIG. 8, the vertical axis of the left side indicates the amount of change in the threshold voltage (dVth) and the horizontal axis indicates time.

Referring to FIG. 8, an example case is shown where after a program pulse (pgm pulse) of 13 V is applied for 100 μs, a memory cell is read using a read voltage (Vread) of 4.5 V. An amount of change in the threshold voltage until saturation is about 0.1 V at a time of about 40 μs, and about 0.01 V at a time of about 500 μs, after the program voltage Vpgm is applied.

Therefore, a longer time is needed until the threshold voltage of a memory cell is saturated after the program voltage Vpgm is applied. In a programming method according to example embodiments, the time for the threshold voltage of a memory cell to reach the saturation state may be shortened by applying a perturbation pulse.

Figure 9:
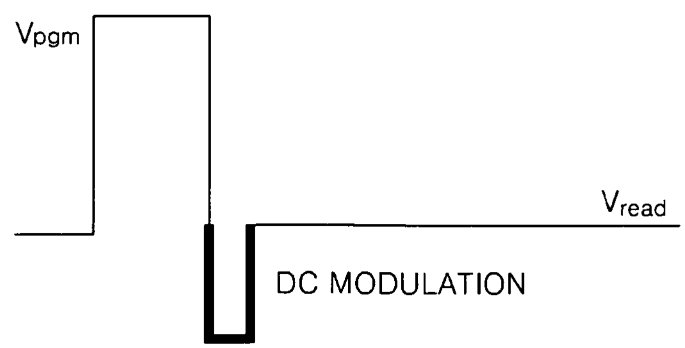
FIG. 9 is an example waveform of a voltage pulse if a DC perturbation pulse of an opposite polarity is applied after a program pulse.
Figure 10:
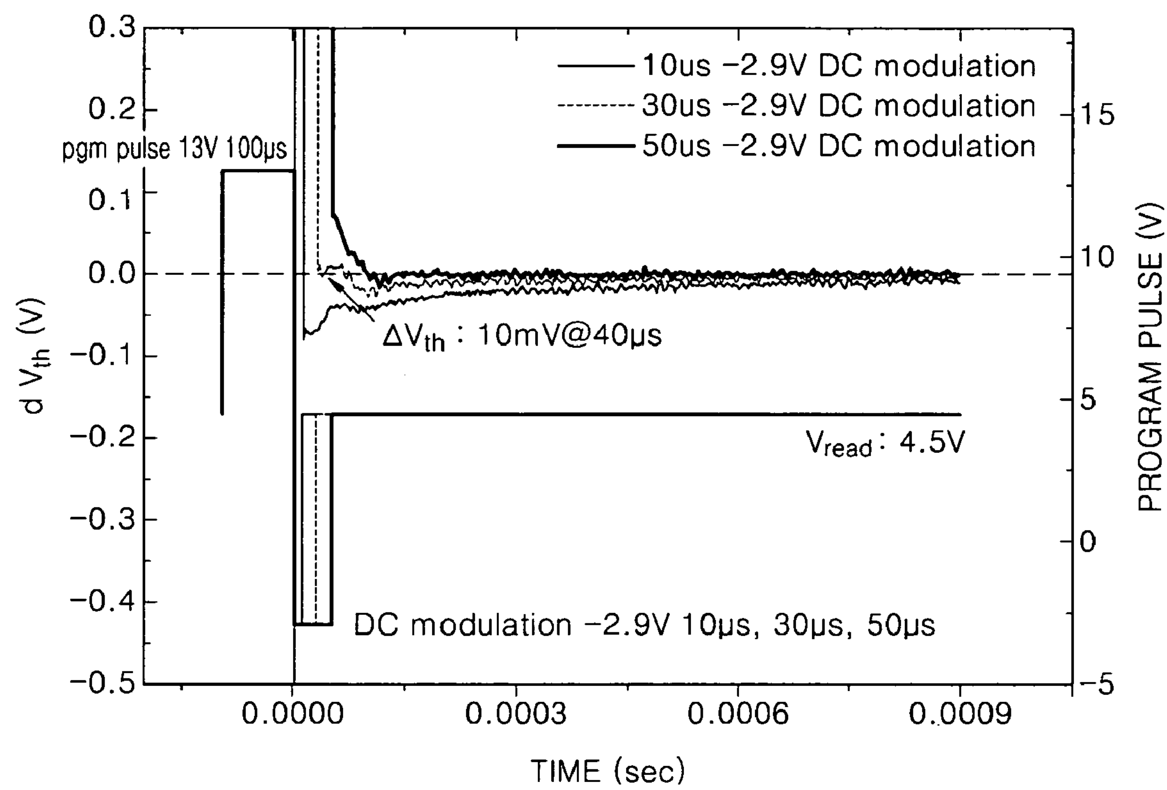
FIG. 10 is an example graph showing a change in a threshold voltage of a memory cell according to a DC perturbation pulse application time if the DC perturbation pulse, (e.g., DC modulation), of an opposite polarity is applied after the program voltage is applied, as shown in FIG. 9.

FIG. 9 is an example waveform of a voltage pulse if a DC perturbation pulse (e.g., DC modulation) of an opposite polarity is applied after a program pulse Vpgm. FIG. 10 is an example graph showing a change in a threshold voltage of a memory cell according to the DC perturbation pulse application time if the DC perturbation pulse (e.g., DC modulation) of the opposite polarity is applied after the program voltage Vpgm is applied, as shown in FIG. 9. In FIG. 10, the vertical axis of the left side indicates the amount of change in the threshold voltage (dVth) and the horizontal axis indicates time.

Referring to FIGS. 9 and 10, an example case is shown where after a program voltage Vpgm of 13 V is applied during a period of 100 μs, a DC modulation of −2.9 V is applied and a memory cell is read using a read voltage Vread of 4.5 V. Comparing FIGS. 8 and 10, the amount of change in the threshold voltage is greatly reduced if the DC modulation is applied for 10 μs, 30 μs, and 50 μs. For example, if a DC modulation of −2.9 V is applied for 30 μs, the threshold voltage change amount ΔVth at a time of 40 μs after the program voltage Vpgm is applied is about 10 mV, which is greatly reduced compared to a threshold voltage change amount ΔVth of about 0.1 V if the DC modulation is not applied.

As can be seen from the comparison between FIGS. 8 and 10, if the DC modulation having a polarity opposite to that of the program voltage Vpgm is applied, a time for the thermalization of a threshold voltage may be greatly shortened.

However, if the perturbation pulse is applied for each step of applying ISPP Vpgm, the program time may be increased as much as a multiplication of the perturbation pulse application time by a number of applications. Therefore, in a programming method according to an example embodiment, a perturbation pulse may be applied only if the memory cell passes a verification using a first verification voltage Vref, where the first verification voltage Vref' is set in consideration of a difference between a threshold voltage during the verification and a threshold voltage value after the thermalization.

Figure 11A:
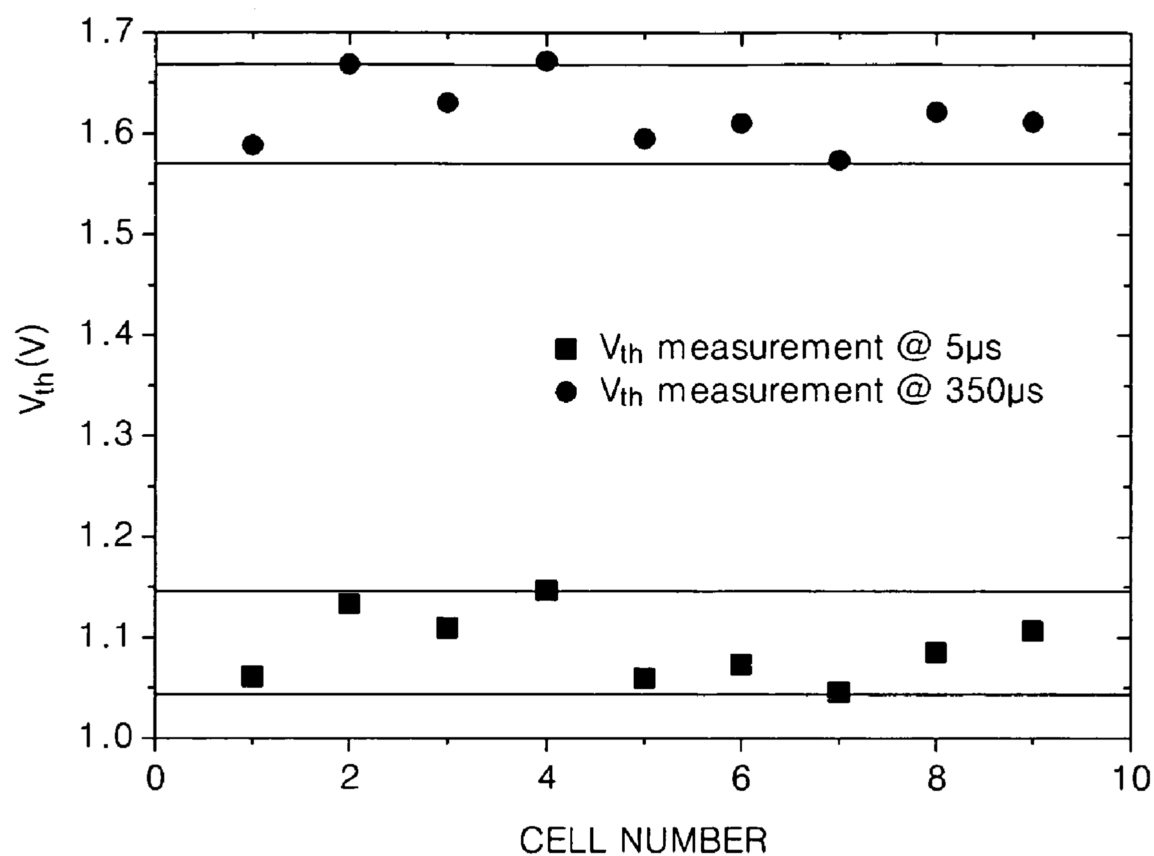
FIG. 11A is an example graph showing a difference in a threshold voltage with respect to time due to a threshold voltage transient phenomenon of memory cells after a program voltage is applied.
Figure 11B:
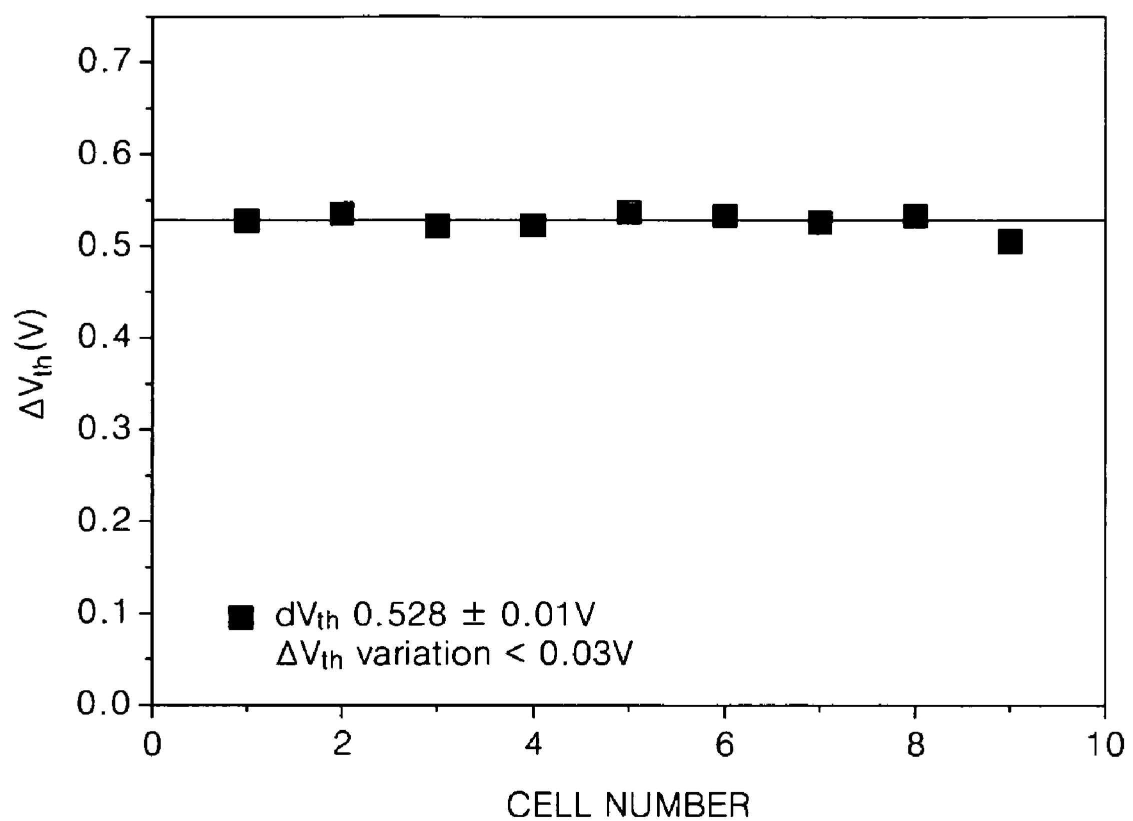
FIG. 11B is an example graph showing a change in an amount of a threshold voltage ΔVth with respect to the time from 5 μs to 350 μs for each memory cell in FIG. 11A.

FIG. 11A is an example graph showing a difference in a threshold voltage according to time due to a threshold voltage transient phenomenon of memory cells after a program voltage Vpgm is applied. FIG. 11B is an example graph showing a change in an amount of a threshold voltage ΔVth according to a time from 5 μs to 350 μs for each memory cell in FIG. 11A. FIG. 11A shows a distribution of the threshold voltage value of the memory cells if 5 μs and 350 μs pass after the program voltage Vpgm is applied.

As shown in FIGS. 11A and 11B, the threshold voltage distribution of the memory cells for a same measurement time is about −0.1 V. The threshold voltage value of each memory cell varies as much as 0.528±0.01 V according to the time from 5 μs to 350 μs. FIG. 11B shows that the amount of change in the threshold voltage value of the memory cell during the verification and after the thermalization is about 0.528 V, and that a difference in the amount of change in the threshold voltage value of the memory cells is not greater than 0.03 V.

Because the difference between a threshold voltage value of the memory cell during the verification and a threshold voltage value of the memory cell after the thermalization is a constant value within an error range of 0.03 V, for example, about 0.528 V, the first verification voltage Vref' may be set in consideration of the value.

Figure 12:
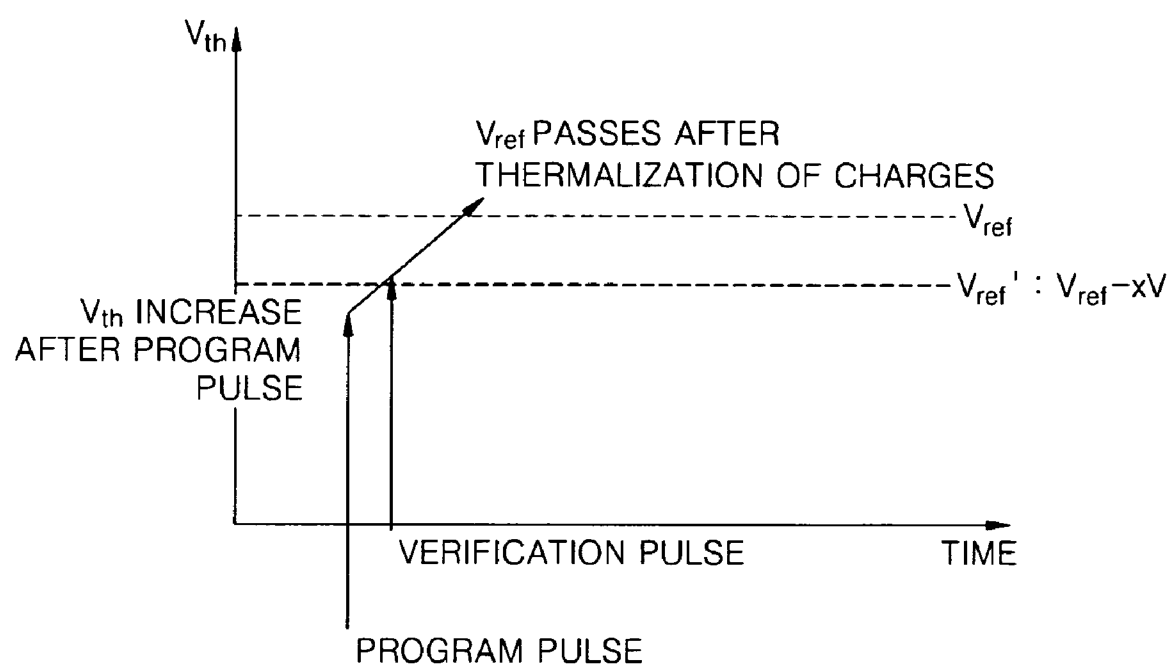
FIG. 12 is an example graph showing an example embodiment in which, if a first verification voltage is set to be less than a second verification voltage by a difference between a threshold voltage during verification and a threshold voltage after thermalization, a verification using the first verification voltage Vref' is passed and thermalized and a verification using the second verification voltage Vref is passed by an increase in a threshold voltage after a program pulse application.

For example, the first verification voltage Vref' may be set as a value less than the second verification voltage Vref from a difference between a threshold voltage during the verification and a threshold voltage after the thermalization. For example, the first verification voltage Vref' may be set such that Vref'=Vref−xV, where V signifies voltage, as shown in FIG. 12. Because the difference between a threshold voltage value during the verification and a threshold voltage value after the thermalization is less than 1 V, 0<x<1. However, "x" may vary within the above range according to the program voltage Vpgm or a record page. Because the program is performed formed in units of word lines, the record page may correspond to the word line.

FIG. 12 is an example graph showing an example case in which, if the first verification voltage Vref' is set to be less than the second verification voltage Vref by a difference between a threshold voltage during the verification and a threshold voltage after the thermalization, a verification using the first verification voltage Vref' is passed and thermalized and a verification using the second verification voltage Vref is passed by an increase in a threshold voltage after a program pulse application.

As described above, according to a programming method of example embodiments, a thermalization of charges may be facilitated by adding a perturbation pulse so that a threshold voltage is saturated in a faster time. Accordingly, over-programming due to a determination error may be reducing and a threshold voltage distribution may be improved.

A program time may be increased as much as a multiplication of perturbation pulse application time and application number ($t_{perturbation\ pulse}$×m) if the perturbation pulse is applied for each ISPP. According to an example embodiment, a verification voltage may be divided into two steps so that the perturbation pulse is applied only after the verification using a first verification voltage Vref' is passed. Therefore, the threshold voltage distribution is reduced and a program time may be shortened compared to a case of applying the perturbation pulse for each ISPP.

By adopting a programming method according to example embodiments, because the distribution of threshold voltage values of the memory cells corresponding to each record state is smaller, each record state in a multi-level cell operation may be separately recognized.

Although example embodiments have been shown and described in this specification and figures, it would be appreciated by those skilled in the art that changes may be made to the illustrated and/or described example embodiments without departing from their principles and spirit.

What is claimed is:

1. A method of programming a non-volatile memory device, the method comprising:

performing a first programming operation including applying a program voltage to a memory cell and verifying the memory cell using a first verification voltage;

applying a perturbation pulse to the memory cell to facilitate thermalization of charges in the memory cell if the memory cell passes the verification using the first verification voltage; and verifying the memory cell using a second verification voltage greater than the first verification voltage after the perturbation pulse is applied.

2. The method of claim 1, further comprising:

performing a second programming operation including applying the program voltage to the memory cell, applying the perturbation pulse to facilitate the thermalization of charges in the memory cell, and verifying the memory cell using the second verification voltage if the memory cell does not pass the verification using the second verification voltage.

3. The method of claim 2, wherein, in the second programming operation, the applying the program voltage, the application of the perturbation pulse, and the verification using the second verification voltage are repeated by increasing an amount of the program voltage step by step each repetition until the memory cell passes the verification using the second verification voltage in the second programming operation.

4. The method of claim 3, wherein, in the first programming operation, the applying the program voltage and the verifying the memory cell using the first verification voltage are repeated by increasing the amount of the program voltage step by step each repetition until the verification using the first verification voltage is passed in the first programming operation.

5. The method of claim 1, wherein, in the first programming operation, the applying the program voltage and the verifying the memory cell using the first verification voltage are repeated by increasing an amount of the program voltage step by step each repetition until the verification using the first verification voltage is passed in the first programming operation.

6. The method of claim 1, wherein, if the first verification voltage is Vref' and the second verification voltage is Vref, $Vref'=Vref-xV$, where $0<x<1$ and V is a voltage.

7. The method of claim 1, wherein a difference between the first and second verification voltages is based on a difference between a threshold voltage value of the memory cell during a verification of the memory cell and a threshold value of the memory cell after thermalization of the memory cell.

8. The method of claim 1, wherein the memory cell comprises a control gate and a charge storage layer, the program voltage is applied to the control gate of the memory cell, and the perturbation pulse is applied to one of the control gate of the memory cell, a substrate on which the memory cell is formed, and a channel of the memory cell.

9. The method of claim 8, wherein the perturbation pulse applies an electric field opposite to an electric field of the program voltage.

10. The method of claim 8, wherein the memory cell is one of a floating gate type flash memory cell and a charge trap type flash memory cell.

11. The method of claim 8, wherein the memory cell is a memory cell selected from a plurality of memory cells arranged in a NAND structure between a common source line and a plurality of bit lines on the substrate.

12. The method of claim 1, wherein the memory cell is a memory cell selected from a plurality of memory cells arranged in a NAND structure between a common source line and a plurality of bit lines on a substrate.

13. The method of claim 12, wherein the memory cell is one of a floating gate type flash memory cell and a charge trap type flash memory cell.

14. The method of claim 1, wherein the verification of the memory cell using the first verification voltage verifies a threshold voltage of the memory cell, and the verification of the memory cell using the second verification voltage verifies the threshold voltage of the memory cell.

* * * * *